June 1, 1971 J. KOCSIS 3,582,330

METHOD AND APPARATUS FOR MAKING SEMICONDUCTOR DEVICES

Filed Dec. 9, 1964 2 Sheets-Sheet 1

INVENTOR
J. KOCSIS
BY
Roderick B. Anderson
ATTORNEY

June 1, 1971 J. KOCSIS 3,582,330

METHOD AND APPARATUS FOR MAKING SEMICONDUCTOR DEVICES

Filed Dec. 9, 1964 2 Sheets-Sheet 2

3,582,330

METHOD AND APPARATUS FOR MAKING SEMICONDUCTOR DEVICES

Joseph Kocsis, Jefferson, N.J., assignor to Bell Telephone Laboratories, Incorporated, New York, N.Y.

Filed Dec. 9, 1964, Ser. No. 417,095
Int. Cl. G03c *5/00;* B01j *17/00;* H01l *5/00*
U.S. Cl. 96—36.2 8 Claims

ABSTRACT OF THE DISCLOSURE

Masking apparatus and techniques are disclosed for the fabrication of objects such as high frequency semiconductor devices that have extremely closely spaced elements. For example, the invention can be used to position an elongated emitter electrode between two elongated base electrodes. In the space on a wafer ordinarily occupied by a single conventional transistor, a number of transistors are fabricated with photo-resist and masking. The mask used to define the emitter electrodes in such a case comprises an array of stripes. However, most of the stripes are slightly misaligned with respect to the corresponding pair of base electrodes or are slightly too large or too small. Thus, even if the mask is slightly misaligned, at least one of the misaligned stripes on the mask is found to be correctly aligned with the pair of base electrodes. And even if the photo-resist is slightly under-exposed or over-exposed, at least one of the different sized stripes compensates for it. Consequently, production of at least one good transistor is assured even if the mask is misaligned or the exposure time is other than optimum. And because the combined area of the good and bad transistors on the wafer is the same as the area of a conventional transistor, no part of the wafer is wasted.

This invention relates to methods and apparatus for locating elements on a substrate which are in very close proximity to each other, and more particularly, to methods and apparatus for locating closely spaced electrodes on high frequency semiconductive devices.

It is well recognized that inter-electrode reactances seriously limit the high frequency capabilities of transistors and other semiconductive devices. In most cases, the only effective way of reducing these reactances is by closely spacing the electrodes. Hence, electrode spacings of several microns or even of less than one micron are sometimes required to give satisfactory operation of certain microwave frequency transistors.

These extremely rigorous fabrication tolerances have led to sophisticated etching and evaporation techniques for making the required junction and electrode contacts. Such techniques typically employ a series of masks for precisely locating successive areas of selective etching and evaporation. Even with the precision which is attainable with processes such as the photo-resist technique, it has been impractical to produce commercial quality devices having electrode spacings of less than five microns. Although masks can be fabricated to these tolerances, it is difficult to align them properly with a reasonable degree of consistency. Further, it is difficult consistently to control the etching to the precise limits defined by the photo-resist. As a result, attempts at mass producing devices with such closely spaced electrodes have been largely unsuccessful and the majority of them typically have to be rejected.

An object of this invention is the fabrication of devices which include extremely closely spaced elements.

A specific object of an illustrative embodiment of this invention is the fabrication of semiconductive devices having extremely closely spaced electrodes.

These and other objects of my invention are attained in an illustrative embodiment thereof comprising a method and apparatus for defining closely spaced electrodes on a planar microwave transistor. The illustrative transistor includes a wafer of p-type material having on part of its surface a diffused layer of n-type material. Two parallel elongated base electrodes are evaporated onto the diffused layer with an elongated emitter electrode alloyed between them. The alloy emitter region forms a junction with the diffused layer to provide a p-n-p transistor.

In accordance with this illustrative embodiment, nine pairs of base electrodes are formed on the wafer, although only one pair is to be used in the finished device. A layer of silicon dioxide coated with photo-resist material is then deposited over the wafer including the base electrodes. A transparent mask having thin opaque stripes is placed over the layer such that one stripe is approximately located between each pair of electrodes. Light directed through the mask exposes all of the photo-resist material except the portions masked by the opaque stripes. When the photo-resist material is developed, the stripes are dissolved, which permits emitter electrode window stripes to be etched into the silicon dioxide layer to expose parts of the wafer. The emitter electrodes are then alloyed to the exposed wafer portions between the base electrodes in a known manner. In order for any pair of base electrodes and intervening emitter electrodes to be used to form a workable device, the emitter electrode window must be of a precise predetermined width and be accurately aligned between the two base electrodes. Slight longitudinal variations of the location of the emitter electrode window stripe are relatively unimportant.

In accordance with the invention, all but one of the mask stripes are slightly misaligned with respect to a corresponding pair of base stripes, or are too wide or narrow, or a combination thereof. Three of the mask stripes are located slightly to the right of their aligned location and three to the left. The other three are aligned correctly, but one is narrower and another is wider than the desired width of the emitter electrode window. Of the three mask stripes misaligned to the left, one is of the correct width while one is narrower and the other wider than the correct width. Likewise, only one of the stripes misaligned to the right is of the correct width.

It can be appreciated that if the entire mask is misaligned slightly to the right, those stripes which were originally misaligned slightly to the left will be moved into proper alignment. If the photo-resist material is slightly overexposed, the wider apertures will define a stripe of the proper width, while if the photo-resist material is slightly underexposed, the narrower apertures will define a proper width stripe. Hence, even if the mask is slightly misaligned either to the right or left and the photo-resist material is slightly over or underexposed, the probability of defining a single correctly aligned emitter stripe of proper length is very good. The correctly aligned window stripe is preferably determined by examining all of the nine windows before the emitter electrodes are formed. Since only one set of electrodes on a wafer is used, the other eight which contain misaligned or wider or narrower emitter electrodes are ignored. It can be seen that this technique greatly reduces the number of wafers that must be rejected for having unacceptable electrodes and electrode spacings.

These and other objects, features and embodiments of my invention will be more fully appreciated from a consideration of the following detailed description, taken in conjunction with the accompanying drawing, in which.

Figure 1:
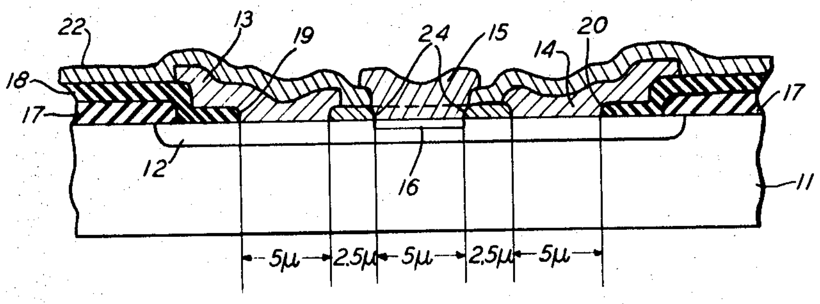
FIG. 1 is a sectional view of part of a transistor which is fabricated in accordance with the principles of the present invention.
Figure 2:
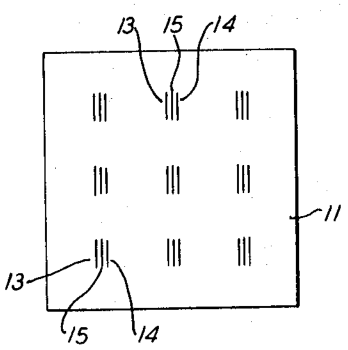
FIG. 2 is a top view of part of a transistor which is fabricated in accordance with the present invention.

Referring now to FIG. 1 there is shown, for illustrative purposes, part of a planar transistor of the kind to be fabricated by a specific embodiment of the present invention. The transistor comprises a germanium wafer 11 whose bulk has a p-type characteristic, having a layer 12 into which a donor such as antimony has been diffused to convert it to n-type material. Base electrodes 13 and 14 are evaporated on the diffused layer. An emitter electrode 15 is alloyed to the diffused layer between the base electrodes to form a p-type alloy region 16 which forms a p-n junction with the bulk of the diffused layer 12. The base and emitter electrodes have thin elongated shapes and are parallel as shown in FIG. 2. The effective widths of the electrodes are determined by their contact area with the wafer; hence, the electrodes have effective widths of 5 microns as shown on the drawing. The emitter electrode is spaced from the base electrodes by a distance on the order of 2.5 microns as is required for high-frequency transistor operation. At a later stage in the fabrication a collector electrode is bonded to the lower surface of the wafer so that the device can be used as a p-n-p transistor.

As can be seen from FIG. 2, the electrodes 13, 14, and 15 of FIG. 1 constitute only one of nine sets of electrodes that are formed on wafer 11. The wafer 11 is of an appropriate conventional size, such as 20 mils by 20 mils, for use as a single transistor. Before discussing the reasons for forming nine sets of electrodes on wafer 11, the conventional technique for defining one set of closely spaced electrodes will be reviewed.

Referring again to FIG. 1, the top surface of the p-type wafer 11 is covered with a layer 17 of a suitable masking material such as silicon dioxide. Part of layer 17 is etched away to permit the formation of diffused layer 12. A second masking layer 18 of silicon dioxide is then applied over the entire surface of the wafer into which openings or base windows 19 and 20 are etched at positions corresponding to the location of the desired base electrodes 13 and 14. The base electrodes 13 and 14 are then deposited, as by evaporation, to make ohmic contact to the wafer portions exposed by base windows 19 and 20.

After the base electrodes have been deposited on the wafer, the entire upper surface of the wafer, including the base electrodes, is covered with a third layer 22 of silicon dioxide. This layer is in turn covered with a thin coating of photo-resist material. A transparent mask having an opaque elongated stripe is placed over the wafer such that the stripe is located between the base electrodes at a position corresponding to that of the desired emitter electrode. Light is directed through the mask to expose the photo-resist material except for an elongated stripe between the base electrodes. When the photo-resist material is photographically developed, the elongated unexposed stripe is dissolved. An emitter window 24 is then etched in the third and second layers by immersing the wafer in a solution of buffered hydrofluoric acid which does not affect that part of the layer which is still coated with the photo-resist.

The defining of window 24 is the most critical step in the fabrication process because it must be precisely located between the base windows 19 and 20; it is the step with which this invention is primarily concerned. The longitudinal position of the emitter window 24 is not critical because of its length and the length of the base electrodes as shown in FIG. 2. The emitter electrode 15 is formed by overlaying aluminum over the entire device and then etching off all of the aluminum except for the roughly T-shaped section defining the emitter electrode. The etching process likewise is not critical because the silicon dioxide layer 22 ensures that no short-circuit is made with the base electrodes. After this step, part of the silicon dioxide layer overlaying the base electrodes is etched off to permit electrical contact with the base electrodes. If so desired, this may conveniently be done by forming a single U-shaped base electrode, the elongated parallel "leg" portions of which define the base electrodes 13 and 14, and then making contact only with the portion that interconnects the two leg portions.

Figure 3:
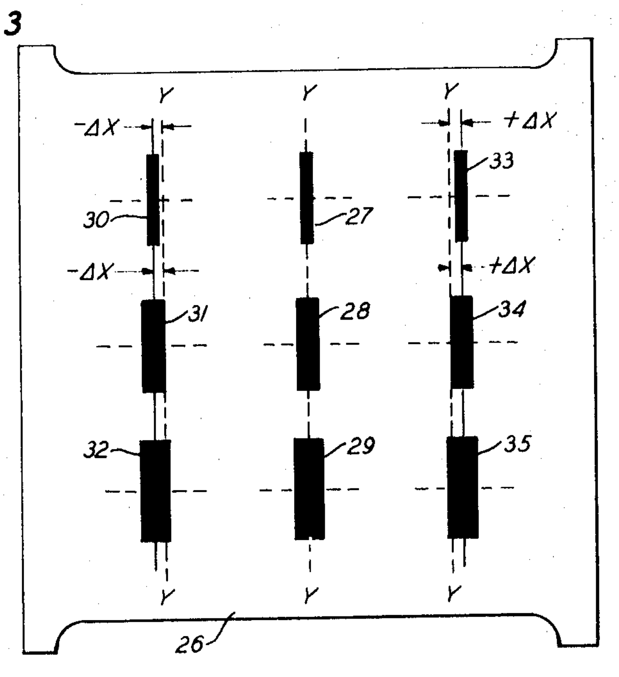
FIG. 3 is a mask which is used for fabricating transistors of the type shown in FIGS. 1 and 2.

In accordance with the invention, nine emitter windows 24 are defined between the base electrodes 13 and 14 of FIG. 2 by opaque stripes in a mask 26 shown in FIG. 3. As mentioned previously, light is directed through the transparent mask 26 to define stripes on the photo-resist layer 23 and thereby define the emitter windows 24. The mask is affixed in any of various known manners over the wafer 11 such that three stripes 27, 28, and 29 are aligned as precisely as possible directly between corresponding base stripes 13 and 14 on the wafer. The remainder of the stripes are positioned with respect to stripes 27, 28, and 29 to be misaligned either to the right or to the left with respect to corresponding base electrodes. With stripes 27–29 aligned properly, stripes 30, 31, and 32 are misaligned slightly to the left a predetermined distance equal to $-\Delta X$, while stripes 33, 34, and 35 are misaligned an equal distance $+\Delta X$ to the right. Reference lines Y are included to show the correct center lines of the stripes if they were all aligned directly between corresponding base electrodes on the wafer 11.

It can be seen that if the mask 26 is accidentally misaligned a distance $+\Delta X$ to the right, the stripes 30, 31, and 32 will be correctly aligned with respect to corresponding base electrodes. If the mask is misaligned to the left a distance $-\Delta X$, then apertures 33, 34, and 35 will be correctly aligned with respect to corresponding base electrodes. With this arrangement the probability of obtaining a correctly aligned emitter window is increased over the conventional technique in which a mask is used only to define a single emitter window between a single pair of base electrodes.

Only the stripes 31, 28, and 34 are of the width of the desired emitter window, viz, 5 microns. The stripes 30, 27, and 33 are slightly narrower than the desired width while stripes 32, 29, and 35 are slightly wider. Therefore, if the photo-resist material is slightly underexposed, the stripes 30, 27, and 33, will define an emitter stripe on the photo-resist coating of the proper width. If the photo-resist material is slightly overexposed to the incoming light, the stripes 32, 29, and 35 will define stripes of nearly the proper width. Hence, a mask 26 made in accordance with my invention inherently compensates for errors due to misalignment to the right or the left and for underexposure or overexposure of the photo-resist material. This results in a substantial reduction in the number of transistor wafers that must be rejected for improper fabrication.

The wafer 11 is a square of approximately 20 mils by 20 mils, which is a convenient dimension for the transistor wafer, regardless of how small the electrodes 13, 15, and 14 are. The area of the wafer which includes the unused electrodes does not represent any wasted space because this surface area would not be utilized even if the transistor were made by conventional techniques. After the fabrication process has been completed, the various emitter windows are inspected by the use of a microscope and the set which is properly aligned and of proper width is used by attaching appropriate contacts to the corresponding emitter and base electrodes.

Figure 4:
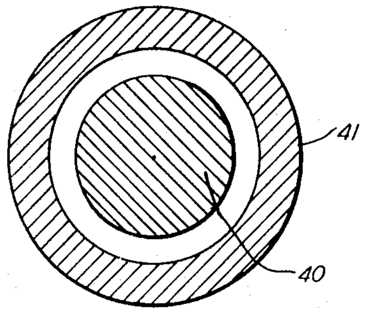
FIG. 4 is a top view of part of another type of transistor.

FIG. 4 shows an alternative transistor configuration comprising a circularly-shaped emitter electrode 40 surrounded by an annular base electrode 41. The base electrode may be bonded to a wafer by an ohmic contact while emitter electrode 40 is alloyed to the wafer to form a transistor that operates in the same general manner as the device shown in FIG. 1. The electrodes may be formed by a series of masking and etching steps as described above, with the object being to align the window defining emitter electrode 40 coaxially within the base electrode 41.

Figure 5:
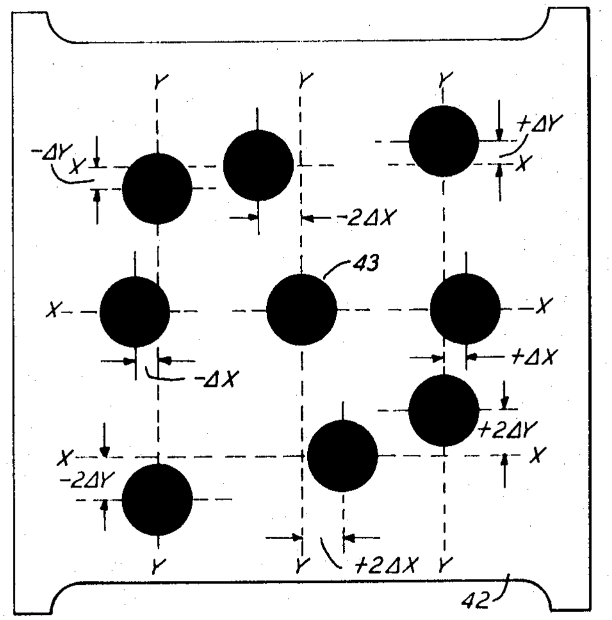
FIG. 5 is a mask used for fabricating transistors of the type shown in FIG. 2.

Nine base electrodes are first formed on a wafer at predetermined locations in the same general manner as described previously. The wafer is then overlaid with a mask 42 shown in FIG. 5 which contains a plurality of opaque circles for masking circular areas within the annular base electrodes for defining emitter windows. The mask is aligned such that the central circle 43 of the array is aligned as closely as possible within a corresponding base electrode. The intersections of the various coordinates X and Y indicate the centers of the remaining base electrodes with respect to the center of circle 43. It can be seen that the remaining circles are misaligned either up or down distances of $\Delta Y$ or $2\Delta Y$ and to the right or left at distances of $\Delta X$ or $2\Delta X$. Misalignments are made in both directions because in this embodiment it is important that the emitter electrode be properly aligned in the Y direction as well as in the X direction. With this arrangement the mask 42 may accidentally be misaligned to the right or left a distance of $\Delta X$ or $2\Delta X$, or it may be misaligned in the Y direction a distance of $\Delta Y$ or $2\Delta Y$. In any of these situations at least one of the circles will be correctly aligned within an annular base electrode. By comparison to a conventional mask for defining only a single emitter window within an annular base electrode, the mask of FIG. 5 increases the probability of correct alignment by a factor of 9.

It is to be understood that the foregoing embodiments have been presented merely to illustrate the principles of my invention. The concept is quite broad and it is not limited to masks for defining windows by the photoresist technique, and indeed is not even restricted to the use of masks. For example, if accurate alignment between a die and a workpiece were required, several identical die projections could be used, some of which are purposely misaligned with respect to corresponding reference locations on the work piece. If the work piece or the die were accidentally misaligned, the misaligned projections would register properly with the workpiece. Masks having apertures are very frequently used for controlling deposition by evaporation and for these purposes masks which use the concepts illustrated in FIGS. 3 and 5 could be used for ensuring the correct location of at least one mask aperture. Numerous other arrangements may be made by those skilled in the art without departing from the spirit and scope of the invention.

What is claimed is:

1. Apparatus for redrawing an elongate vetreous article element that is spaced by a small predetermined distance from a first element and comprises the steps of:

- forming the first element on a portion of a substrate the size of which portion essentially defines the final size of the device to be made; and
- defining the second element adjacent the first element, the improvement characterized by the steps of:
- forming on said portion of the substrate at least three first elements;
- aligning with the first elements a mask comprised of means for defining second elements adjacent said first elements, said second element defining means being located on the mask so that one of said means is approximately at the proper location for forming a second element at the predetermined distance from a first element, at least one of said means is at a location for forming a second element at more than the predetermined distance from another first element, and another of said means is at a location for forming a second element at less than the predetermined distance from another first element, each of said directions being in a single plane;

- forming the second elements; and
- selecting for use the device which has the second element that is closest to said predetermined distance from a first element.

2. The method of claim 1 wherein the device is an electrical device and the first and second elements are electrodes.

3. The method of claim 1 wherein the device is a semiconductor device, the mask is a photo mask, and the second element defining means are opaque areas on the mask.

4. In the method for making a device having a second element that is spaced by a small predetermined distance from a first element and comprises the steps of:

- forming the first element on a portion of a substrate the size of which portion essentially defines the final size of the device to be made; and
- defining the second element adjacent the first element, the improvement characterized by the steps of:
- forming on said portion of the substrate at least three first elements;
- aligning with the first elements a mask comprised of means for defining second elements adjacent said first elements, said second element defining means being located on the mask so that one of said means is approximately at the proper location for forming a second element at the predetermined distance from a first element, at least one other said means is slightly misaligned in a first direction from said proper location with respect to another first element, and at least one other said means is slightly misaligned in a second direction, diametrically opposite to the first direction, from said proper location with respect to another first element, each of said directions being in a single plane;
- forming the second elements; and
- selecting for use the device which has the second element that is closest to said predetermined distance from a first element.

5. A process for forming a second electrode of a semiconductor device at a predetermined distance from a first electrode comprising the steps of:

- forming at least three first electrodes on the top surface of a semiconductor wafer in the surface area normally taken up by one such semiconductor device;
- forming a layer of insulating material overlaying the first electrodes and the top surface of the wafer;
- forming a coating of photo-resist material substantially covering said layer;
- aligning with the first electrodes on the top surface of the wafer a transparent photo mask that is comprised of an array of opaque areas for defining second electrodes adjacent said first electrodes, said areas being located on the mask so that one area is approximately at the proper location for forming a second electrode at the predetermined distance from a first electrode, at least one other area is slightly misaligned in a first direction from said proper location with respect to another first electrode, and at least one other area is slightly misaligned in a second direction, diametrically opposite to the first direction, from said proper location with respect to still another first electrode, each of said directions being in a single plane;
- directing light through the mask to imagewise expose the photo-resist coating;
- dissolving that portion of the photo-resist material that is soluble in a developer solution;
- removing from the layer that portion of insulating material that is not protected by the remaining photo-resist material;
- forming second electrodes on that portion of the wafer where the insulating material has been removed; and
- selecting for use in said semiconductor device a pair of first and second electrodes that are separated by a distance closest to said predetermined distance.

6. The process of claim 5 wherein said first electrodes are annular rings which do not overlap and said opaque areas for defining second electrodes are circular regions of different diameters.

7. A process for forming a second electrode of a semiconductor device at a predetermined distance from a first electrode comprising the steps of:

forming at least three first electrodes on the top surface of a semiconductor wafer in the surface area normally taken up by one such semiconductor device;

forming a layer of insulating material overlaying the first electrodes and the top surface of the wafer;

forming a coating of photo-resist material substantially covering said layer;

aligning with the first electrodes on the top surface of the wafer a transparent photo mask that is comprised of an array of opaque areas for defining second electrodes adjacent said first electrodes, said areas being located on the mask so that one area is approximately at the proper location for forming a second electrode at the predetermined distance from a first electrode, at least one other area is at a location for forming a second electrode at more than the predetermined distance from a corresponding first electrode, and another area is at a location for forming a second electrode at less than the predetermined distance from a corresponding first electrode, each of said directions being in a single plane;

directing light through the mask to imagewise expose the photo-resist coating;

dissolving that portion of the photo-resist material that is soluble in a developer solution;

removing from the layer that portion of insulating material that is not protected by the remaining photo-resist material;

forming second electrodes on that portion of the wafer where the insulating material has been removed; and selecting for use in said semiconductor device a pair of first and second electrodes that are separated by a distance closest to said predetermined distance.

8. The process of claim 7 wherein each said first electrode comprises a pair of parallel electrodes and said opaque areas for defining second electrodes are rectangular regions of different widths that are aligned between the parallel pairs of electrodes that comprise the first electrodes.

References Cited

UNITED STATES PATENTS

| | | | |
|---|---|---|---|
| 2,959,105 | 11/1960 | Sayanagi | 96—116X |
| 3,025,589 | 3/1962 | Hoerni | 96—36.2UX |
| 3,079,254 | 2/1963 | Rowe | 96—36.2 |
| 3,148,085 | 9/1964 | Wiegmann | 96—44X |
| 3,245,794 | 4/1966 | Conley | 96—36.2UX |
| 3,265,542 | 8/1966 | Hirshon | 96—36.2UX |

OTHER REFERENCES

Adams, S., "Microphoto Patterns As Masks," Industrial Photography, vol. 11, August 1962 (pp. 34 and 48 relied on).

Hellmers et al., "Microphotographs for Electronics," Semiconductor Products, vol. 4, January 1961, (pp. 37–42 relied on).

Kauffman, H. A., "Photographic Plates for Kinescope Aperture Mask," RCA Tech. Notes, March 1958 (RCA Tn. No. 149).

Rudge et al., "Fly's-Eye . . . Masks," IBM Journal, vol. 7, April 1963 (pp. 146–150 relied on).

NORMAN G. TORCHIN, Primary Examiner

C. L. BOWERS, Jr., Assistant Examiner

U.S. Cl. X.R.

96—27, 36, 38.4; 29—578